US012309962B2

(12) United States Patent
Anderl et al.

(10) Patent No.: US 12,309,962 B2
(45) Date of Patent: May 20, 2025

(54) CONFIGURABLE MULTI-CHIP MODULE HEATSINK FOR SELECTIVE DISSIPATION OF HEAT

(71) Applicant: International Business Machines Corporation, Armonk, NY (US)

(72) Inventors: William James Anderl, Rochester, MN (US); Alex Matos, Rochester, MN (US); Brenda Berg, Rochester, MN (US); Kevin O'Connell, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 489 days.

(21) Appl. No.: 17/655,581

(22) Filed: Mar. 21, 2022

(65) Prior Publication Data

US 2023/0301014 A1    Sep. 21, 2023

(51) Int. Cl.
*H05K 7/20*    (2006.01)

(52) U.S. Cl.
CPC ..... *H05K 7/20145* (2013.01); *H05K 7/20309* (2013.01); *H05K 7/20336* (2013.01)

(58) Field of Classification Search
CPC .......... H05K 7/20145; H05K 7/20309; H05K 7/20336
USPC ................................................ 165/80.3, 80.4
See application file for complete search history.

(56) References Cited

U.S. PATENT DOCUMENTS

| | | | | |
|---|---|---|---|---|
| 2,153,359 A * | 4/1939 | Anderson | ................. | B61C 1/12 454/103 |
| 2,310,086 A * | 2/1943 | Howard | .................... | F28B 1/06 165/DIG. 138 |
| 3,500,899 A * | 3/1970 | Shane, Jr. | .............. | G05D 23/01 165/277 |
| 4,739,444 A * | 4/1988 | Zushi | ................. | H05K 7/20563 361/691 |
| 6,365,260 B1 * | 4/2002 | Stecher | ............... | H01L 25/0655 428/188 |
| 6,385,044 B1 * | 5/2002 | Colbert | ................. | H01L 23/427 165/185 |
| 6,694,759 B1 * | 2/2004 | Bash | .................... | G05D 16/202 454/255 |

(Continued)

FOREIGN PATENT DOCUMENTS

WO         99/39557 A1    8/1999

OTHER PUBLICATIONS

International Searching Authority, Notification of Transmittal of the International Search Report and the Written Opinion of the International Searching Authority, Jun. 1, 2023, 11 pages, International Application No. PCT/EP2023/053318.

*Primary Examiner* — Claire E Rojohn, III
(74) *Attorney, Agent, or Firm* — Kimberly Zillig

(57) ABSTRACT

A heat sink to selectively dissipate heat from a plurality of heat-generating components. The heat sink includes a plurality of heat pipes, and a base plate configured to locate at least one of the plurality of heat pipes proximate each of the plurality of heat-generating components. The heat sink also includes a plurality of sets of fins operable to dissipate heat generated by the heat-generating components, and a plurality of sets of louvers, wherein each of the plurality of sets of louvers is associated with one of the plurality of sets of fins and is operable to open to selectively allow airflow from outside the heat sink to dissipate heat from one of the plurality of sets of fins.

18 Claims, 13 Drawing Sheets

(56) References Cited

U.S. PATENT DOCUMENTS

| | | | | |
|---|---|---|---|---|
| 7,031,154 B2* | 4/2006 | Bash | | H05K 7/20736 236/49.5 |
| 7,117,930 B2* | 10/2006 | Todd | | F28F 1/32 257/E23.102 |
| 7,140,422 B2* | 11/2006 | Malone | | F28D 15/0275 257/714 |
| 7,408,774 B1* | 8/2008 | Anderl | | G06F 1/20 415/60 |
| 8,978,747 B2* | 3/2015 | Peterson | | H05K 7/20836 165/909 |
| 9,392,731 B2* | 7/2016 | Mann | | H01L 23/4006 |
| 10,058,012 B2* | 8/2018 | Curtin | | H05K 7/20618 |
| 10,091,911 B2* | 10/2018 | Kelty | | G02B 6/4269 |
| 10,473,226 B2* | 11/2019 | Simpson | | F28D 7/0025 |
| 10,651,063 B2* | 5/2020 | Flitsch | | H01L 21/67276 |
| 10,721,842 B1* | 7/2020 | Fathi | | H05K 7/20809 |
| 10,834,855 B2* | 11/2020 | Ghadiri Moghaddam | | H05K 7/20745 |
| 10,856,446 B2* | 12/2020 | Boyden | | G06F 1/183 |
| 11,852,834 B1* | 12/2023 | Wang | | G02B 27/0176 |
| 11,903,170 B2* | 2/2024 | Alfoqaha | | H05K 7/20736 |
| 2009/0225515 A1* | 9/2009 | Hom | | H05K 7/20781 165/181 |
| 2012/0160456 A1* | 6/2012 | Aoki | | H01L 23/427 165/104.26 |
| 2014/0360699 A1* | 12/2014 | van Schoor | | H01L 23/467 165/96 |
| 2018/0098463 A1* | 4/2018 | Campbell | | H05K 7/20172 |
| 2019/0111862 A1* | 4/2019 | Dede | | H05K 7/20145 |
| 2019/0335616 A1* | 10/2019 | Anderl | | H05K 7/20727 |
| 2020/0029463 A1* | 1/2020 | Han | | F28F 13/06 |
| 2020/0141666 A1* | 5/2020 | McMillan | | F28F 13/12 |
| 2020/0281099 A1* | 9/2020 | Klaba | | H05K 7/20309 |
| 2020/0325905 A1* | 10/2020 | Smailes | | F04D 29/703 |
| 2021/0227725 A1* | 7/2021 | Park | | H05K 7/20827 |
| 2021/0259133 A1 | 8/2021 | Narasimhan et al. | | |
| 2021/0345519 A1* | 11/2021 | Tian | | H05K 7/20809 |
| 2023/0023287 A1* | 1/2023 | Rajput | | F24F 1/0059 |
| 2023/0108011 A1* | 4/2023 | Cramer | | G06F 1/20 455/90.3 |
| 2023/0148257 A1* | 5/2023 | Chia | | H05K 7/20145 361/679.49 |
| 2023/0200002 A1* | 6/2023 | O'Connell | | H05K 7/1425 312/213 |
| 2023/0301014 A1* | 9/2023 | Anderl | | H01L 23/34 361/688 |

* cited by examiner

CONFIGURABLE MULTI-CHIP MODULE HEATSINK FOR SELECTIVE DISSIPATION OF HEAT

BACKGROUND

The present disclosure relates generally to cooling of electronic components, and more particularly to structures and processes for focusing airflow within a multi-chip module heatsink to address critical regions of the multi-chip module that are generating the most heat.

A multi-chip module (MCM) is an electronic package consisting of multiple integrated circuits (ICs) assembled into a single device. An MCM works as a single component and is capable of handling an entire function. The various components of an MCM are mounted on a substrate. The surface temperature of an MCM is increased based on the amount of heat generated per unit area due to the concentration of electronic components.

Electronic components, such as microprocessors and integrated circuits, must operate within certain specified temperature ranges to perform efficiently. Excessive heat degrades electronic component performance, reliability, life expectancy, and can even cause failure. Heat sinks are widely used for controlling excessive heat. Typically, heat sinks are formed with fins or other similar structures to increase the surface area of the heat sink and thereby enhance heat dissipation as air passes over the heat sink.

SUMMARY

According to some embodiments of the disclosure, there is provided a heat sink configured to be attached to and selectively dissipate heat from a plurality of heat-generating components. The heat sink includes a plurality of heat pipes, and a base plate having a top surface and having a bottom surface for attaching to the plurality of heat-generating components, wherein the base plate is configured to locate at least one of the plurality of heat pipes proximate each of the plurality of heat-generating components. The heat sink further includes a plurality of sets of fins operable to dissipate heat generated by the heat-generating components, wherein each of the plurality of sets of fins is configured to dissipate heat from one of the plurality of heat-generating components, and a plurality of sets of louvers, wherein each of the plurality of sets of louvers is associated with one of the plurality of sets of fins and is operable to open to selectively allow airflow from outside the heat sink to dissipate heat from one of the plurality of sets of fins.

According to some embodiments of the disclosure, there is provided a. heat sink assembly. The heat assembly includes a plurality of heat-generating components, and a heat sink attached to the plurality of heat-generating components. The heat sink includes a plurality of heat pipes, and a base plate having a top surface and having a bottom surface for attaching to the plurality of heat-generating components, wherein the base plate is configured to locate at least one of the plurality of heat pipes proximate each of the plurality of heat-generating components. The heat sink also includes a plurality of sets of fins operable to dissipate heat generated by the heat-generating components, wherein each of the plurality of sets of fins is configured to dissipate heat from one of the plurality of heat-generating components. The heat sink further includes a plurality of sets of louvers, wherein each of the plurality of sets of louvers is associated with one of the plurality of sets of fins and is operable to open to selectively allow airflow from outside the heat sink to dissipate heat from one of the plurality of sets of fins.

According to some embodiments of the disclosure, there is provided a process of selectively dissipating heat from at least one of a plurality of heat-generating components of a multi-chip module. The process includes operations of providing a plurality of heat-generating components, and providing a heatsink. The heat sink includes a plurality of heat pipes, and a base plate having a top surface and having a bottom surface for attaching to the plurality of heat-generating components, wherein the base plate is configured to locate at least one of the plurality of heat pipes proximate each of the plurality of heat-generating components. The heat sink also includes a plurality of sets of fins operable to dissipate heat generated by the heat-generating components, wherein each of the plurality of sets of fins is configured to dissipate heat from one of the plurality of heat-generating components. The heat sink further includes a plurality of sets of louvers, wherein each of the plurality of sets of louvers is associated with one of the plurality of sets of fins and is operable to open to selectively allow airflow from outside the heat sink to dissipate heat from one of the plurality of sets of fins. Another process operation includes selectively activating at least one of the plurality of sets of fins to allow heat to be dissipated from at least one heat-generating component.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
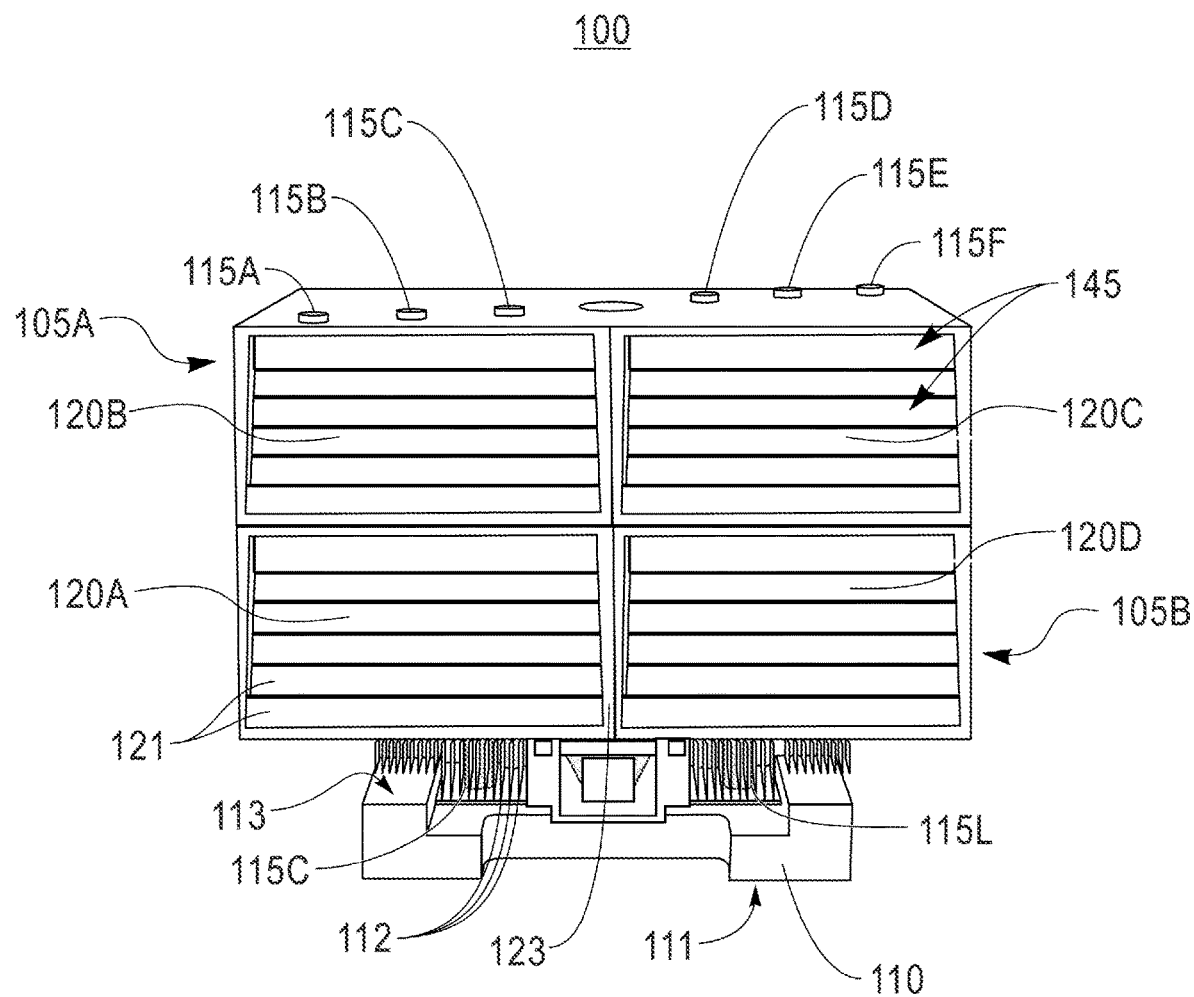
FIG. 1 is an isometric view of a heat sink, in accordance with embodiments of the disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure relate generally to cooling of electronic components, and more particularly to structures and processes for focusing airflow within a multi-chip module (MCM) heatsink to address critical regions of the MCM that are generating the most heat. While the present disclosure is not necessarily limited to such applications, various aspects of the disclosure can be appreciated through a discussion of various examples using this context.

Turning to an overview of the technologies that are more specifically relevant to aspects of the present disclosure, in order to improve yields and cost, manufacturers are moving to processor configurations that include multiple chiplets in a single module. A "chiplet" is a tiny IC that contains a well-defined subset of functionality. Due to variability of the manufacturing process, not all chiplets can produce the same amount of power and in some cases entire chiplets may be turned off. This results in an imbalance of heat distribution across the top of the module and, therefore, changes the efficiency and effectiveness of an associated heatsink. With a single heatsink for all chiplet configurations, some airflow may be wasted by cooling regions of the module that are dissipating less heat, and yet other regions may not get enough airflow to produce sufficient cooling.

Heat sinks are typically formed of metals, such as copper or aluminum. More recently, graphite-based materials have been used for heat sinks because such materials offer several advantages, such as improved thermal conductivity and reduced weight.

Embodiments described in the disclosure provide both passive (or static) and active ways to configure and/or adjust a heatsink in order to provide selective cooling (i.e., dissipation of heat) of corresponding heat-generating components within certain regions of an MCM. Airflow can be directed or focused over higher demand or critical regions that are generating the most heat and away from those generating less heat. The disclosure also details heatsink configurations or layouts to enable variable MCM cooling. Fin arrangement in the heatsink can be configured during installation to match a chiplet arrangement in the MCM. An example passive process can utilize a heat memory material in the fins, activated by certain temperatures, for example, to allow more or less airflow through sets of fins corresponding to particular chiplets. Some example active processes can utilize a torsion spring or a thermal actuator, for example, that responds to a presence of heat in a region of one or more chiplets regions, and that opens louvers on a portion of the heat sink, which can allow more airflow to be provided to certain sets of fins corresponding to warm chiplets, in order to selectively dissipate heat from the chiplets.

One feature and advantage of the disclosed structures and processes is that configurable or selective cooling of regions of an MCM can result in improved cooling for hot chips. Another feature is that baffling of portions of disclosed structures can be statically or dynamically adjusted rather than by using increased fan speeds to cool chips. Using fans less to cool the chips can reduce energy or power consumption. Slower fan speeds can be possible when a subset of chiplets is active and only selective cooling of them is performed rather than general cooling of all of the chiplets. Yet another advantage is that the disclosed structures are able to support more power on configurations with fewer chiplets. In addition, lower acoustic output can also be possible using the disclosed structures and processes.

For the sake of brevity, conventional techniques related to semiconductor device and IC fabrication may or may not be described in detail herein. Moreover, the various tasks and process steps or operations described herein can be incorporated into a more comprehensive procedure or process having additional operations or functionality not described in detail herein. In particular, various operations in the manufacture of semiconductor devices and semiconductor-based ICs are well known and so, in the interest of brevity, many conventional operations will only be mentioned briefly herein or will be omitted entirely without providing the well-known process details.

For purposes of description herein, the terms "upper," "lower,", "left" "rear," "right," "front," "vertical," "horizontal," and derivatives thereof shall relate to a heat sink 100 as oriented in FIG. 1. However, it is to be understood that the heat sink can assume various alternative orientations and step sequences, except where expressly specified to the contrary. It is also to be understood that the specific devices and processes illustrated in the attached drawings, and described in the following disclosure, are simply exemplary embodiments of the inventive concepts defined in the appended claims. Hence, other physical characteristics relating to the embodiments disclosed herein are not to be considered as limiting, unless the claims expressly state otherwise.

Turning to the figures, FIG. 1 is a front view of the heat sink 100, according to an embodiment of the disclosure. The heat sink 100 includes a first side wall 105A and a second side wall 105B, a base plate 110, a plurality (four (4) are shown) of sets of louvers 120A, 120B, 120C and 120D, a plurality of sets of fins inside (four (4) sets are included, but not visible in FIG. 1), and a plurality of heat pipes 115A-L running therethrough (twelve (12) heat pipes are included, but not all visible or completely visible in FIG. 1).

The first and second side walls 105A, 105B are shown in FIG. 1 and located on the sides of the heat sink 100. The side walls 105A, 105B can serve to encase and/or secure the fin stack 124 (shown in FIG. 2) inside. The side walls 105A, 105B can be made of the same material as the fins (discussed in detail below), or can be made of an alternative, suitable material, and can be soldered to the fin stack 124 (in FIG. 2). The side walls 105A, 105B are optional. However if included, the side walls 105A, 105B can beneficially provide structural support and/or handling protection to the heat sink 100. The side walls 105A, 105B can also prevent airflow loss out the sides of the heat sink 100, which can improve performance.

The base plate 110 of the heat sink 100 can have a bottom surface 111 that is mountable to a heat source, which is an electronic or electrical device (not shown). A top surface 113 of the base plate 110 has sets of fins, etc. mounted thereon, which are described in more detail below. The base plate 110 can be formed from materials such as aluminum, copper, aluminum nitride, and/or other metal alloys, plastic, ceramic, graphite, and/or epoxy, and/or any other suitable heat-conducting material. In one embodiment, the base plate 110 can be formed from a continuous piece of aluminum alloy and its bottom can be shaped to fit the contour of one or more heat-generating components (e.g., 205A-D in FIG. 3). The base plate 110 can be any shape suitable to be attached to or adjacent at least one of the heat-generating components (e.g., 205A-D in FIG. 3), such as, for example, an electronic component mounted to a printed circuit board. The base plate 110 can be integral, i.e., formed as a continuous body of material that has a high propensity for conducting heat, or the base plate 110 can be formed in multiple attached pieces, i.e., non-integral. The base plate 110 can be formed from two different materials, such as for example, aluminum in a first region and copper in a second region. The two regions can be attached together by conventional means such as bolting or gluing with heat-conductive adhesive. The base plate 110 can secure lower ends of the plurality of heat pipes 115A-L adjacent any heat-generating components (e.g., 205A-D in FIG. 3) that are located below the base plate 110. The base plate 110 can also include other components for attachment purposes, etc.

As shown in FIG. 1, a plurality of thin, vertical fins 112 are located between, and can attach, the base plate 110 and portions of the heat sink 100 above the base plate 110. The plurality of vertical fins 112 can be soldered to the base plate 110. The plurality of vertical fins 112 can also serve to fill space. The vertical fins 112 can limit airflow bypass to the plurality of sets of fins 125A-D above (shown in FIG. 2), and can provide some cooling effects.

Figure 2:
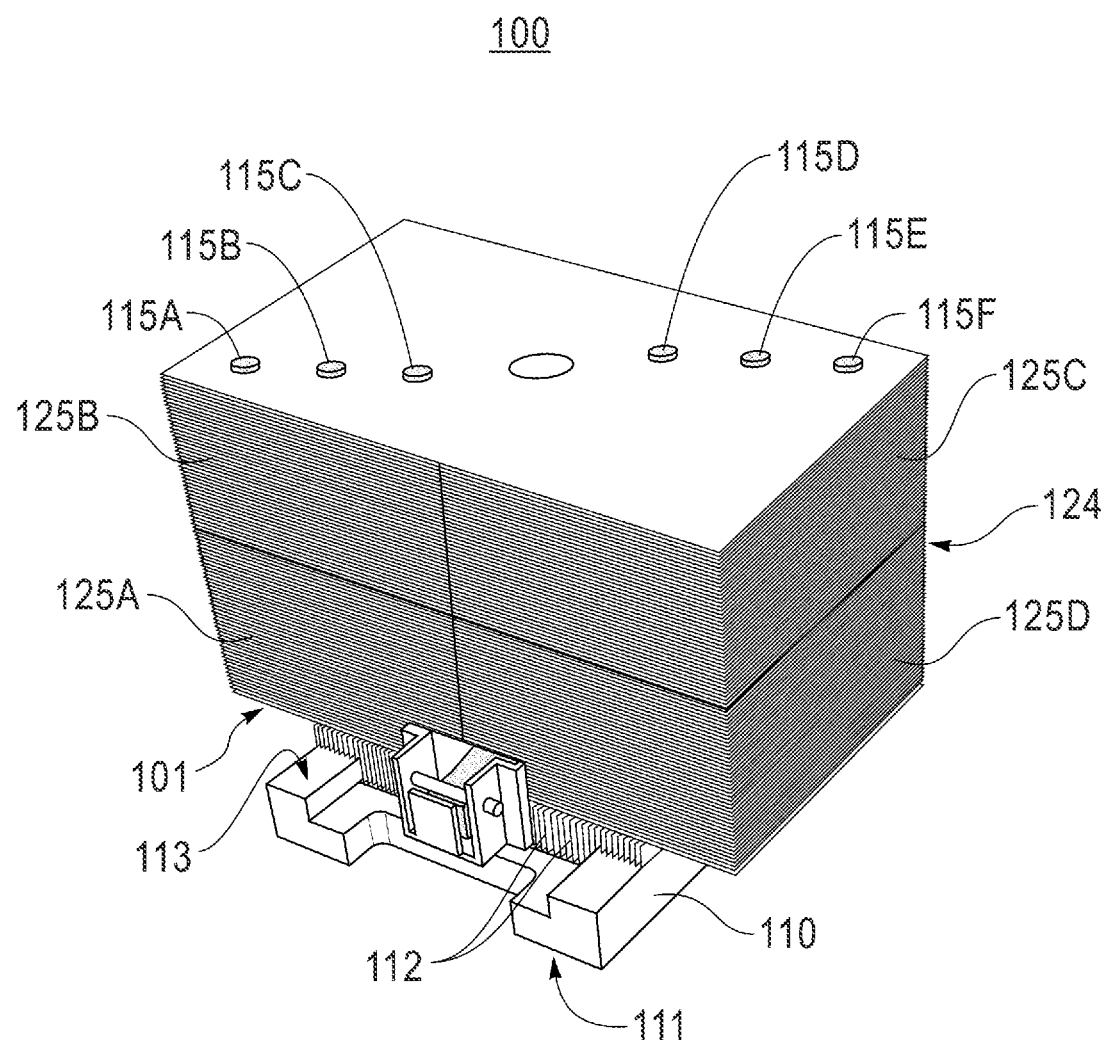
FIG. 2 is a partial cut-away, isometric view of the heat sink of FIG. 1, in accordance with embodiments of the disclosure.

Each of the four sets of louvers 120A-D, in FIG. 1, individually correspond to one set of the plurality of sets of fins within the heat sink 100 (set of fins 125A-D are visible in FIG. 2, and discussed in detail below). The term "louvers" can be defined as a set of angled slats or flat strips fixed or hung at regular intervals in a shutter or frame, for example, to allow air to selectively pass through by opening or closing of the slats or flat strips. Such louvers can control airflow through the heat sink 100.

In FIG. 1, some of individual angled slats or strips in the sets of louvers 120A-D, are indicated by 121. Angled slats or flat strips (such as indicated by 121) in the sets of louvers 120A-D can be arranged in a plurality of parallel rows that are vertically-arranged, for example, as shown. The sets of louvers 120A-D can include a frame portion 123 that holds the slats or strips 121 substantially parallel one to the other and perpendicular to the base plate 110, for example. However, other suitable orientations or combinations of orientations of slats or strips 121 are also contemplated. The slats or strips 121 can be opened hinge up or hinge down, for example. When the slats or strips 121 are in an open position, air can flow through flow channels that are located between the slats or strips 121. When the slats or strips 121 are in a closed position, airflow between the slats or strips 121 is restricted.

The sets of louvers 120A-D can be arranged on and attached to the airflow introduction side (or front side 101 (see FIG. 2)) of the heat sink 100, and when the sets of louvers 120A-D are open, they allow air to pass through them and to the corresponding quadrant (or set of fins 125A-D) of the fin stack 124 of the heat sink 100. When a given set or sets of louvers 120A-D is/are closed, air is not allowed to flow through the corresponding, adjacent quadrant (or the corresponding set of fins 125A-D) of the fin stack 124 of the heat sink 100. Processes of opening and/or closing the sets of louvers 120A-D, in order to selectively cool the corresponding sets of fins 125A-D, are described in more detail below.

There are twelve (12) heat pipes 115A-115L included in the plurality of heat pipes in the embodiment shown in FIG. 1. It is contemplated, however, that other numbers of the heat pipes are also possible. All of the heat pipes 115A-115L are not visible in each figure. The heat pipes 115A-115L can be attached to the base plate 110 in any conventional manner, including adhesive, form-fitted ("snapped on"), harnessed, bolted, etc. In order to control heat distribution and generally select dissipation of such heat within the heat sink 100, for example, the heat pipes 115A-L can be evenly distributed within the heat sink 100.

The heat pipes 115A-L can be vacuum-sealed pipes that are filled with a heat-transfer liquid, such as water, and that has an interior wall covered with a wicking material. As an associated heat-generating component heats up, the "hot" end of each heat pipe closest to the heat-generating component (e.g., 205A-D in FIG. 3) also heats up. The liquid near the hot end of the heat pipe eventually evaporates and the resultant vapor collects at the "cool" end of the heat pipe where the vapor then condenses. The condensed liquid flows back to the hot end of the heat pipe via the wicking. Evaporating liquid again migrates to the cool end of the heat pipe. This evaporating/condensing cycle repeats as the heat pipe transfers heat so efficiently that the hot end of the heat pipe is kept at or near the same temperature as the cool end. Furthermore, because the boiling point of the fluid changes with the pressure, the vacuum within the heat pipe can be set such that boiling occurs at a desired temperature. Other heat pipe designs are, however, also contemplated by the disclosure.

The heat pipes 115A-L can be designed for a specific electronic, heat-generating component. For example, a particular base plate of a particular heat pipe or pipes can have typically the same or approximately the same shape and area as the surface area of the heat-generating component to be cooled. Therefore, heat-generating components having different surface areas and/or shapes typically need heat pipes that are specifically designed for those particular areas and shapes. The heat pipes used in heat-generating component cooling can have a relatively large diameter (greater than ¼ of an inch (0.635 cm)). Furthermore, sometimes the base plate of the heat pipes can be rectangular and the heat pipe itself can be round so the base-pipe interface can have a complex design. For example, the rectangular base plate can have a hollow interior that joins the interior of the cylindrical heat pipe. The diameter of the heat pipe affects the amount of heat transfer through the heat sink 100. As the projected planar surface area of a heat pipe increases with its diameter, the increase in diameter increases the air resistance, as the air is forced to flow around the pipe, thus reducing the air cooling effects.

A plurality of sets of fins 125A-D in the fin stack 124 are included and are located within the heat sink 100, but are not visible in FIG. 1. FIG. 2 shows a partial-cutaway, isometric view of the heat sink 100 in which the four (4) sets of fins 125A-D, forming quadrants of fins in the fin stack 124 of the heat sink 100, are visible. It is contemplated that other numbers of sets of fins are also possible. As shown in FIG. 1, each of the four (4) sets of fins 125A-D corresponding to one part of the quadrant, has a corresponding one of the sets of louvers, 120A, 120B, 120C or 120D, associated with the set of fins 125A-D. Air can flow from the front side 101 of the heat sink 100 through one or more of the sets of louvers 120A-D to the set of fins 125A-D and can continue to exit a back side of the heat sink 100 (not visible). Selective cooling of certain heat-generating components under the heat sink 100, and corresponding to certain sets of fins 125A-D, is possible by selectively opening and closing certain sets of louvers 120A-D. Depending upon the presence and/or amount of heat being generated by heat-generating components under the heat sink 100, specific sets of louvers 120A-D can be opened or closed.

The sets of fins 125A-D, and individual fins 126 (see FIG. 11), can be stationary, metal surfaces that are integral to the heat sink 100. The sets of fins 125A-D can be formed by either machining a solid base block (e.g., integral or skived fins) or by being attached to another portion of the heat sink 100 in a conventional matter (e.g., folded fins). For example, the fins 126 can be made by machine folding a continuous strip of sheet metal into a zigzag shape. Folded fins can also be made with a wave pattern along a length or with more complex shapes to increase turbulence in airflow and improve thermal performance. Other suitable processes of forming fins and any suitable materials used are also contemplated by the disclosure.

Figure 3:
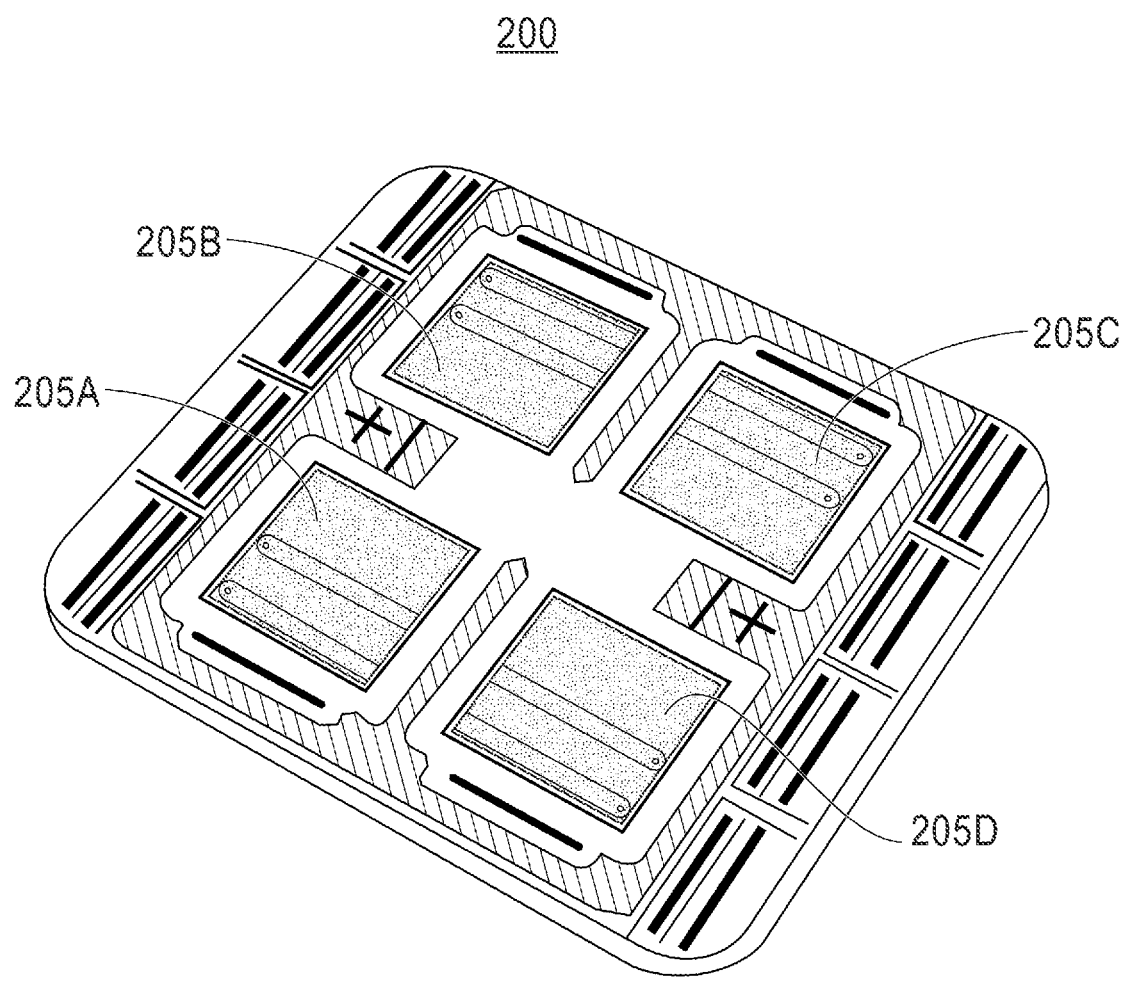
FIG. 3 is an isometric view of a plurality of heat-generating components on a portion of a processor, in accordance with embodiments of the disclosure.

FIG. 3 illustrates an isometric view of a portion of a processor 200 including a plurality of heat-generating components 205A-D, in accordance with embodiments of the disclosure. Four (4) of the heat-generating components 205A-D are shown, which coordinate with the quadrants or the four (4) sets of fins 125A-D in the fin stack 124 of the heat sink 100 (one heat-generating component can correspond to each of the sets of fins 125A-D). A "heat-generating component" is any device capable of generating heat that is undesirable, most typically, an electronic component such as a central processing unit (CPU), for example. Other suitable numbers of the heat-generating components are contemplated, however, and similarly other numbers of the sets of fins are possible in the disclosed heat sink.

Figure 4:
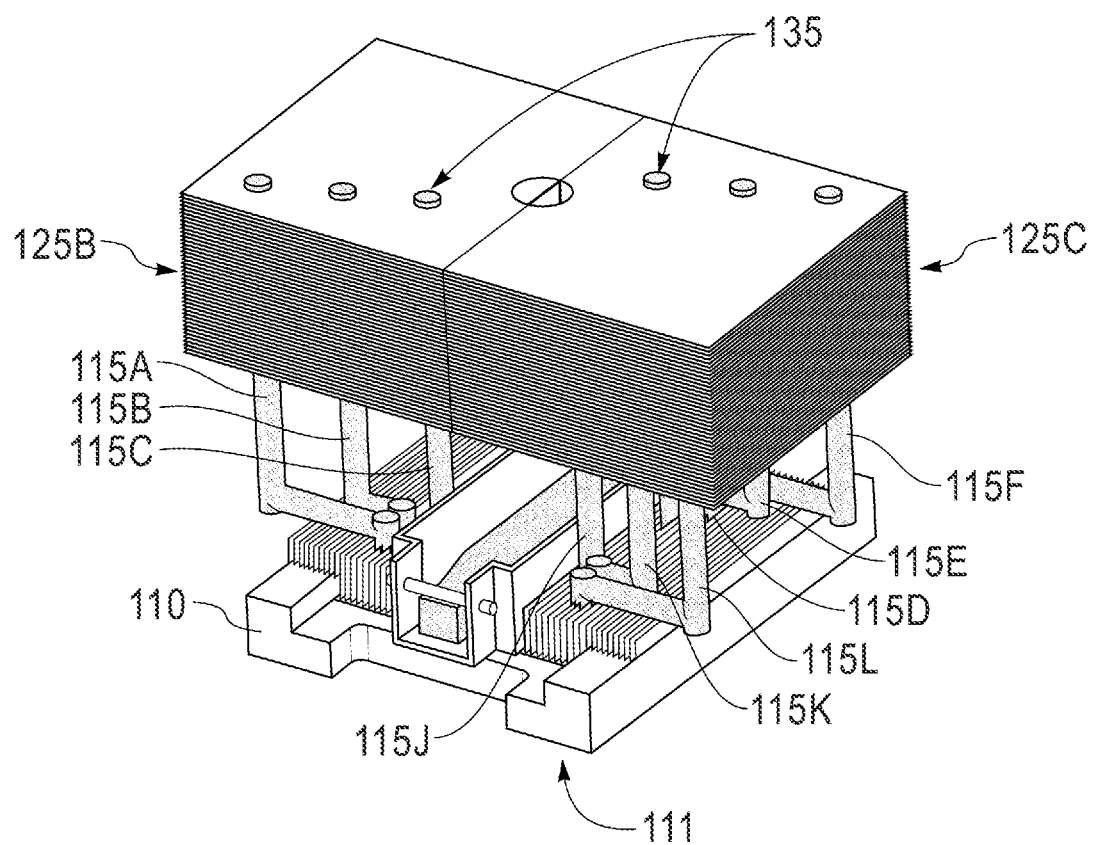
FIG. 4 is a partial cut-away, isometric view of the heat sink of FIG. 1, in accordance with embodiments of the disclosure.
Figure 5:
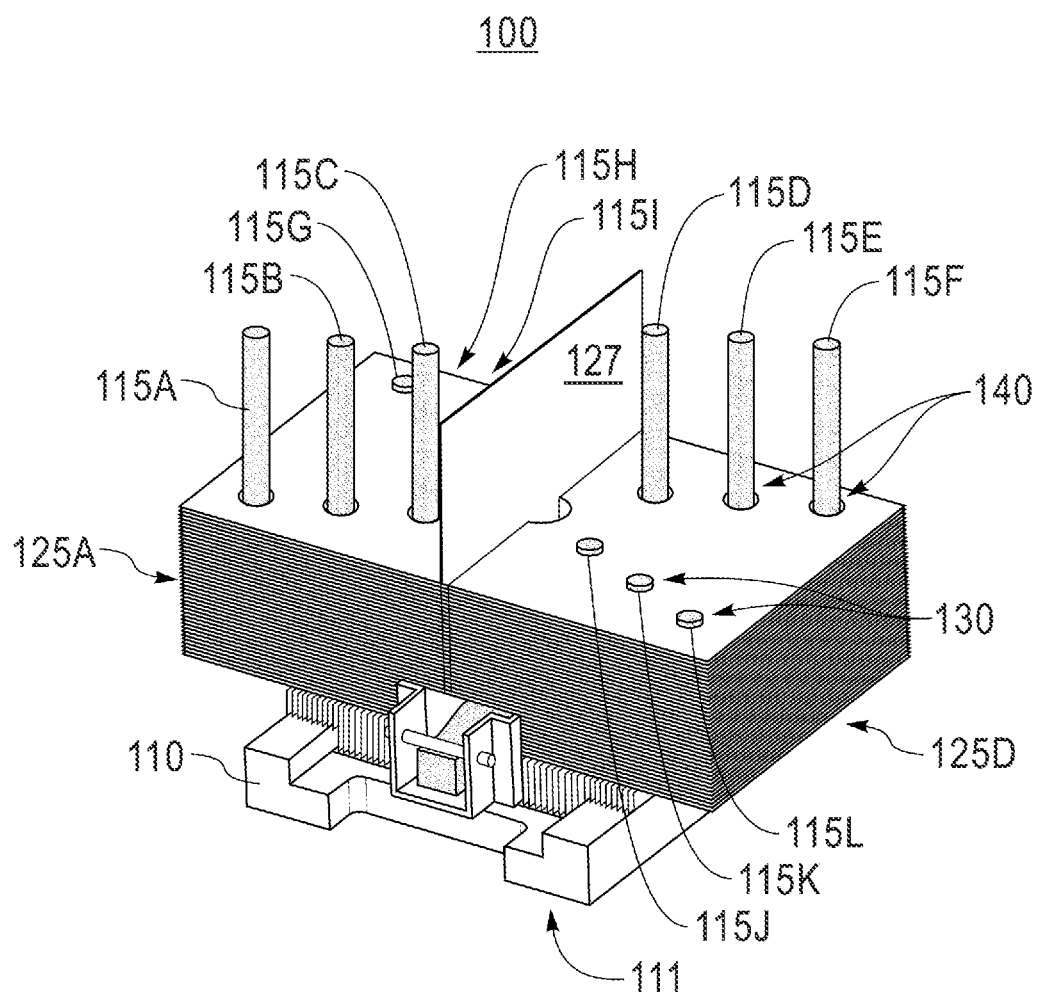
FIG. 5 is a partial cut-away, isometric view of the heat sink of FIG. 1, in accordance with embodiments of the disclosure.

FIGS. 4 and 5 show the heat sink 100 with different portions removed or partially cut-away for better viewing of the plurality of heat pipes 115A-L. In FIG. 4, two lower sets of fins, 125A and 125D, are removed to view nine (9) of the twelve (12) heat pipes 115A-F, 115J-L. In FIG. 5, two upper sets of fins, 125B and 125C, are removed to view heat pipes 115A-L. As shown, heat pipes 115A-F have a full height and extend generally to the top of the upper pair of the sets of fins 125B, 125C. Heat pipes 115G-I and 115J-L have a substantially reduced (or about half) height compared to the other heat pipes and extend generally to the top of the lower pair of the sets of fins 125A, 125D. Also, viewable in FIG. 5 is an optional airflow divider 127 that divides right and left halves of the heat sink 100, and can serve to further increase efficiency relating to selective cooling in the heat sink 100. Specifically, the airflow divider 127 separates the sets of fins 125A, B on the left side from the sets of fins 125C, D on the right side. If a divider is not used, a space can be left between the sets of fins 125A, B and the sets of fins 125C, D. In addition, a space can be left (or some material provided) between the lower sets of fin 125A, D and the upper sets of fins 125B, C.

The heat pipes in the lower pair of the sets of fins 125A, 125D, which are heat pipes 115G-L, are only about substantially half the height of the other heat pipes 115A-F, as discussed above. Heat pipes 115G-L are assigned to extend through the lower set of fins 125A, 125D in order to dissipate heat from the heat-generating components located below heat pipes 115G-L. The heat pipes 115G-L, thus, are considered "fin-fit" into fin-fit holes or openings (e.g., a couple of such openings indicated by 130 in FIG. 5) that extend through the lower sets of fins 125A, D in order to effect heat transfer to the fins. "Fin-fit openings" are defined as being openings sized to accommodate the heat pipes 115G-L such that the heat pipes 115G-L are in substantial contact with the outer surface of the openings and thus in substantial contact with a portion of the lower sets of fins 125A, 125D surrounding the fin-fit openings 130. The heat pipes 115G-L can also be soldered to contact a portion of the lower sets of fins 125A, D to assist in heat transfer.

The heat pipes 115A-F that extend to the upper sets of fins 125B, 125C are designed to dissipate heat from the upper sets of fins 125B, C. The holes or openings extending though the upper sets of fins 125B, C for heat pipes 115A-F are also fin-fit holes or openings (e.g., a couple of such opening are indicated by 135 in FIG. 4) in order to effect heat transfer. The heat pipes 115A-F can be soldered to contact a portion of the set of fins 125B, C to assist heat transfer. Holes or openings to accommodate heat pipes 115A-F as they pass through the lower set of fins 125C, D, however, are "fin-clearance" holes or openings (e.g., a couple of such openings indicated by 140 in FIG. 5). Fin clearance openings are those that do not contact heat pipes 115A-F as they pass through the openings, but allow the heat pipes to be surrounded or encircled by the openings without having contact with the inner surface of the openings. Fin clearance openings allow essentially no heat transfer from heat pipes 115A-F as they pass through the lower sets of fins 125B, C and upwards to the upper set of fins 125A, D.

FIG. 4 shows that the heat pipes 115A-L can be attached to the base plate 110 with one or more bends included, according to an embodiment of the disclosure. The heat pipes 115A-L can be bent at any angle from 0° to 180° with respect to the bottom of the base plate 110. Typically, each of the heat pipes is designed such that the radius of curvature with which the heat pipe is bent is gradual enough so that a pinching off of the interior of the heat pipe does not occur. By bending a heat pipe in an L-shape (one 90° angle as shown in FIG. 4), a significantly larger portion of the heat pipe can be in direct contact with a heat-generating component than if the heat pipe were not bent.

Referring back to FIGS. 1 and 5, depending on the quadrant or set of fins 125A-D that are intended to cool particular heat pipes 115A-L, the set of fins 120A-D can be attached to at least one of the plurality of heat pipes 115A-L. As shown, an equal amount of heat pipes (three (3) in example) can associated with each quadrant. It is beneficial to have an equal distribution of the heat pipes amongst the quadrants or other number of sets of fins in a heat sink in order to allow for better dissipation of heat and control of that dissipation of heat within the heat sink 100. The sets of fins 125A-D are intended to increase the heat sink's 100 surface area in order to increase ambient air cooling effects, such as convective heat dissipation. By increasing the ambient air surface contact, heat is dissipated from at least one of the heat-generating electronic components through the heat sink 100 and to the ambient air more efficiently.

Figure 6:
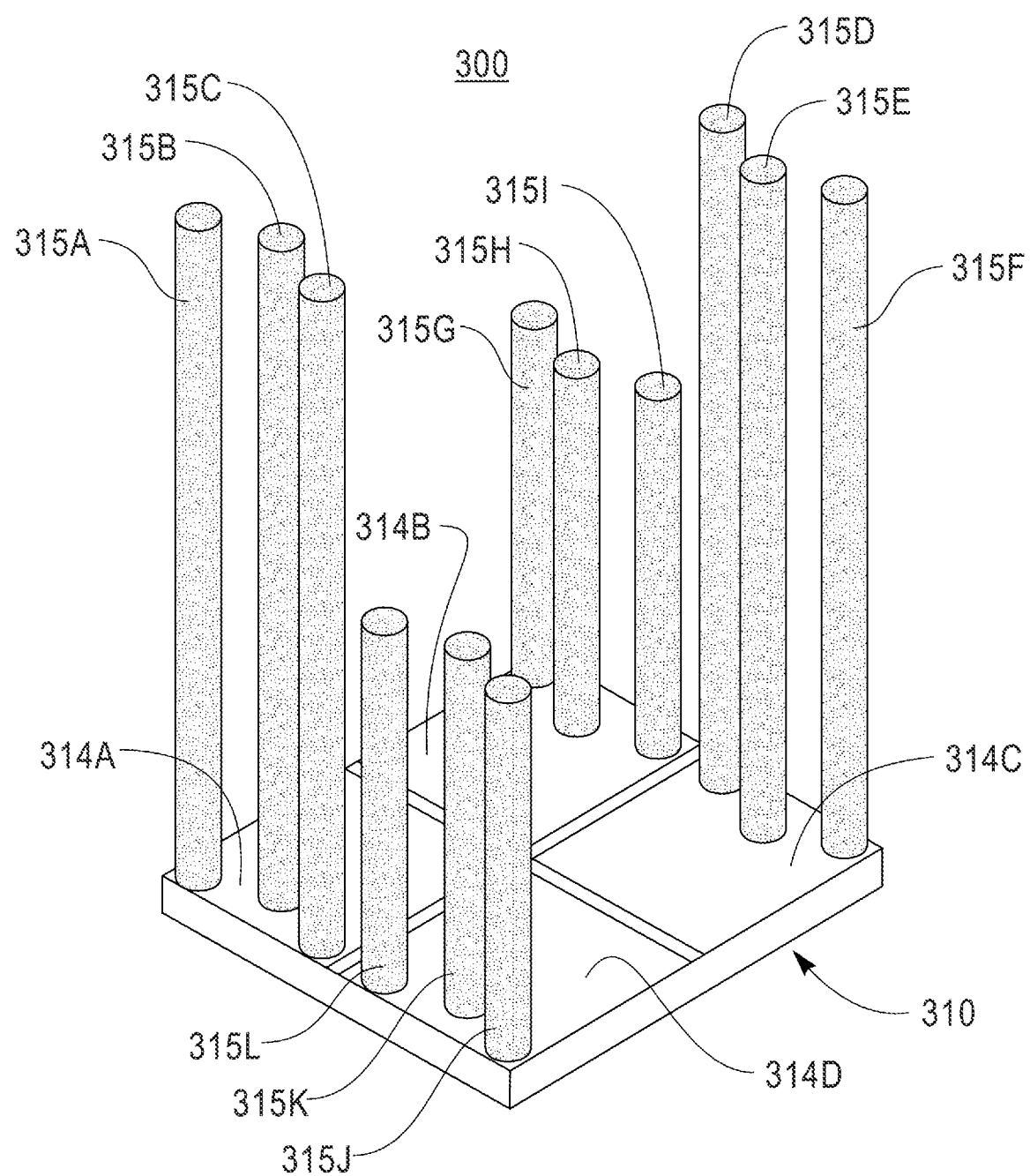
FIG. 6 is a partial, isometric view of a heat sink, in accordance with embodiments of the disclosure.

FIG. 6 is a partial, isometric view of another embodiment of heat sink 300. Not all components are shown but can be similar to those of the heat sink 100 (see FIG. 1). The view of the portion of the heat sink 300 includes a base plate 310 and a plurality of heat pipes 315A-L, and allows those components to be visible with other components not included in the figure. The configuration or arrangement of the heat pipes 315A-L in the heat sink 300 shows another alterative embodiment.

It is not uncommon for heat sinks to contain high performance structures, such as vapor chambers, to further enhance heat transfer. Also included in the portion of heat sink 300 of FIG. 6 are four (4) vapor chambers 314A-D, which are shown within or attached to the base plate 310. One vapor chamber, such as 314A-D, can be associated with each set of fins in the heat sink 300 (not shown, but can be similar to those in the heat sink 100 of FIGS. 1, 2) and located in a quadrant of the base plate 310. One vapor chamber 314A-D can be associated with one heat-generating component located below base plate 310 of the heat sink 300 (if there are four (4) heat-generating components, such as in FIG. 3). Each vapor chamber, such as 314A-D, can be associated with the same number of heat pipes of the plurality of heat pipes. For example, in FIG. 6, three (3) of the twelve (12) heat pipes 315A-L are associated with each vapor chamber 314A-D. Distributing an equal amount of the heat pipes to each of the vapor chambers, as shown, can maximize overall heat sink performance. However, different arrangements and numbers of the heat pipes are also contemplated by the disclosure.

The vapor chambers 314A-D can maximize the thermal performance of the heat sink 300 (only a portion of which is shown), for example. The separation of the vapor chambers 314A-D can prevent heat from being dissipated by the heat pipes 315A-L over lower power regions. The heat sink 100 or 300 disclosed herein can incorporate one or more separate three-dimensional vapor chambers (3DVCs). Other locations and numbers of 3DVCs are also contemplated, however, by the disclosure.

Figure 7:
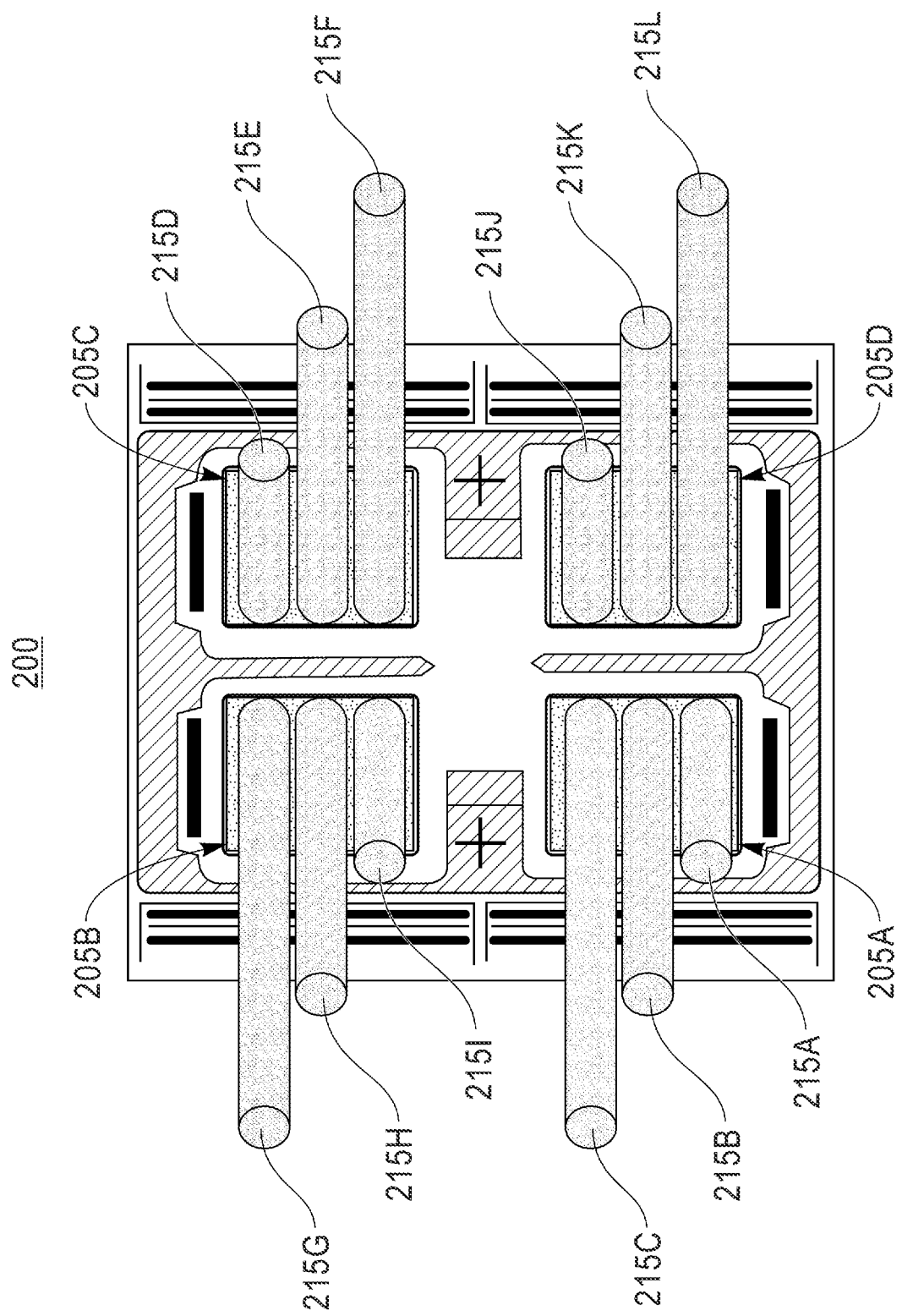
FIG. 7 is a top view of the portion of the processor of FIG. 3, including heat-generating components and a plurality of heat pipes, of a heat sink, proximate the heat-generating components, in accordance with embodiments of the disclosure.

FIG. 7 is a top view of the plurality of heat-generating components 205A-D on the portion of the processor 200 of FIG. 3, but also including a portion of a plurality of heat pipes 215A-L proximate the heat-generating components 205A-D. A lower portion of the heat pipes 215A-L is all that is shown in FIG. 7, which is where heat transfer from the heat-generating components 205A-D to the heat pipes 215A-L can take place. In the embodiment shown, there are three (3) of the heat pipes 215A-L proximate each of the heat-generating components 205A-D. The configuration of the plurality of heat pipes 215A-L is different than the configuration of pipes 115A-L in the heat sink 100, as shown in other figures. The heat pipes 215A-L can terminate within the base plate (not shown), such as along a vertical center line, so that heat flow from a particular quadrant can be cooled by specific heat pipes and can also separate halves of the heat sink. Other suitable configurations and numbers of the heat pipes are also contemplated by the disclosure, however.

Figure 8A:
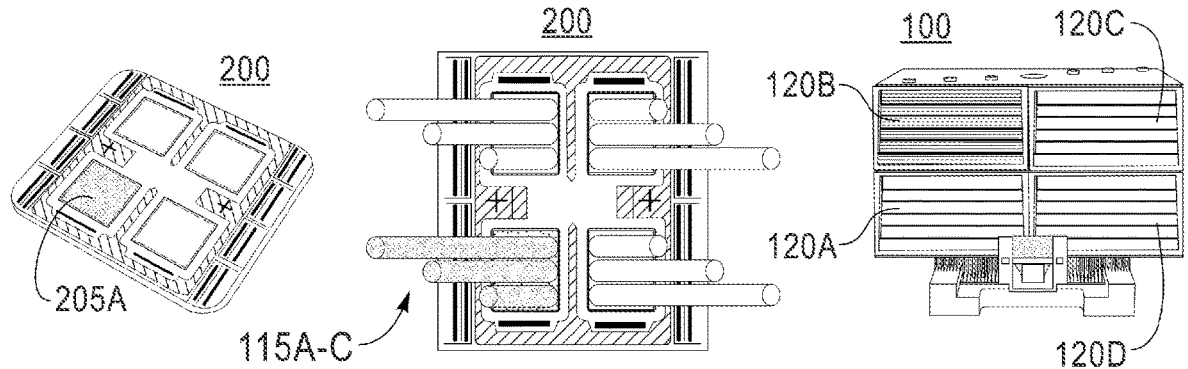
FIGS. 8A-8E illustrate five (5) different examples of a heat sink in selective cooling configurations in order to cool selected heat-generating components using the heat sink, in accordance with embodiments of the disclosure.

FIGS. 8A-8E illustrate five (5) different examples of the heat sink 100 in selective cooling configurations in order to cool selected heat-generating components (of 205A-D) using the heat sink 100. For example, in FIG. 8A, in the heat sink 100 shown on the right in the figure, the upper, left set of louvers 120B is shown open (indicated with gray shading in figure, and with some fins showing in between slats) and the other sets of louvers 120A, 120C and 120D are shown closed (indicated with white color and with slats closed). Also, in FIG. 8A, to the left of the heat sink 100, is a top view of a portion of the processor 200 with portions of the plurality of heat pipes shown above the heat-generating components (e.g., as in FIG. 7). To the left of the processor portion 200 shown with a portion of the heat pipes 115A-L is the portion of the processor 200 without the heat pipes but showing the four (4) heat-generating components (e.g., as in FIG. 3). FIG. 8A shows that the plurality of heat pipes 115A-C (shown as shaded in gray) located over the heat-generating component 205A are cooled (shown with a grayed out shading in figure) due to the set of louvers 120B in the heat sink 100 being open. The sets of pipes over the other heat-generating components 205B-D are lighter in color (shown with a white color in figure) and not cooled (still warm), as indicated. As a result of selective cooling, the heat-generating component 205A, as shown on the left, as grayed out or shaded, is the one being selectively cooled in the example of FIG. 8A. The other heat-generating components 205B-D may not have generated enough heat to activate or open sets of louvers corresponding to the sets of fins above those components, for example.

Figure 8B:
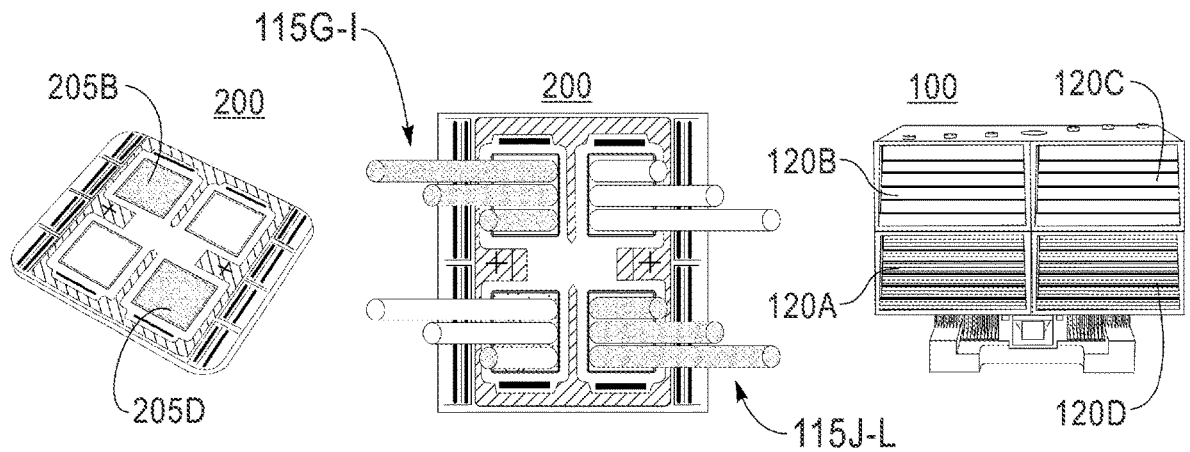

FIG. 8B is another example of selective cooling or dissipation of heat in which the lower half of the fin stack 124 of the heat sink 100 is used for cooling (as shown in other figures), which corresponds to the sets of louvers 120A and 120D being open (indicated by gray shading). The heat pipes 115G-I and 115J-L (shaded in gray) and the set of fins inside the heat sink, accordingly, cool the heat-generating components 205B and 205D in the processor portion 200. The heat-generating components 205B and 205D are shown on the left as shaded in gray to indicate they are cooled by the configuration shown in FIG. 8B.

Figure 8C:
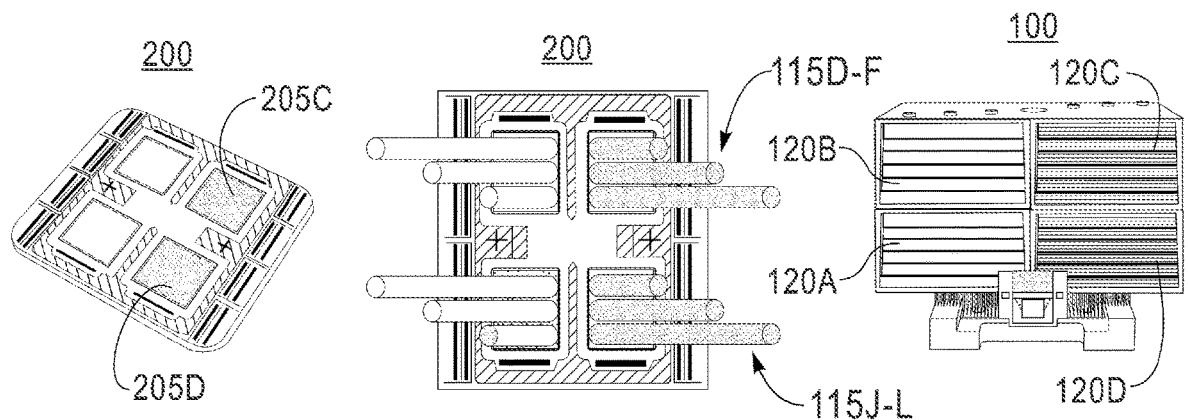

FIG. 8C shows an example of selective cooling in which the two sets of louvers 120C and 120D on the right half of the heat sink 100 are open (shaded in gray). The heat pipes 115D-F and 115J-L (shaded in gray) are being used to dissipate heat from the corresponding sets of fins inside the heat sink 100 (as shown in earlier figures). Accordingly, the heat-generating components 205C and 205D are cooled (shown as shaded in gray).

Figure 8D:
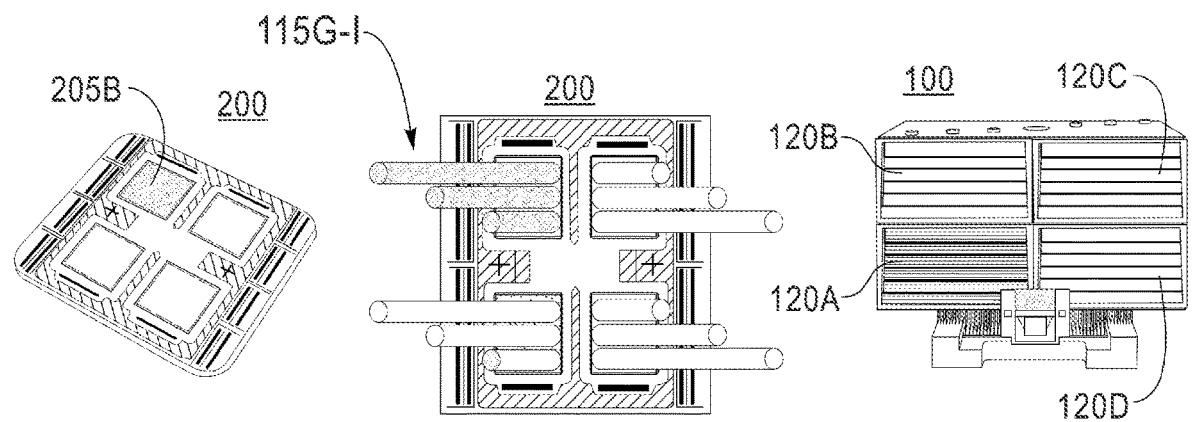

In FIG. 8D, the example includes the lower, left set of louvers 120A being open (shaded in gray). The heat pipes 115G-I are shown shaded in gray to indicate that they are being used to cool heat-generating component 205B (also shaded in gray).

Figure 8E:
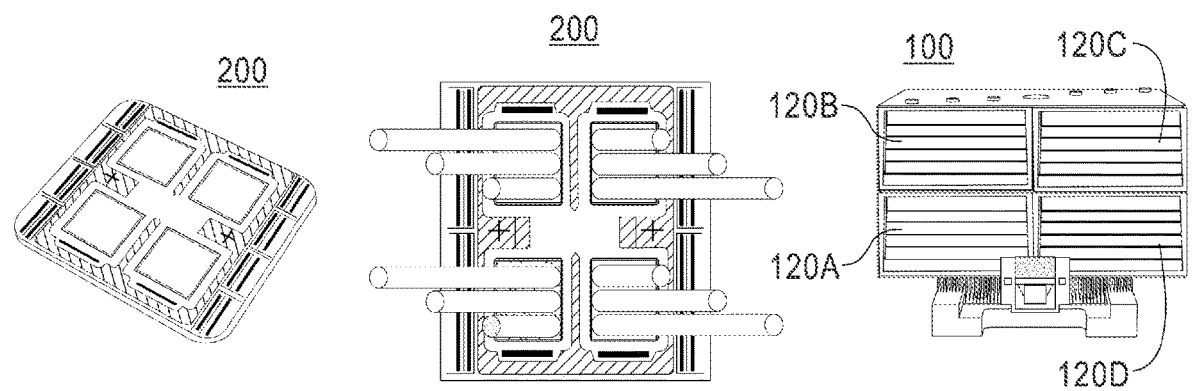

In FIG. 8E, none of the sets of louvers 120A-D are open and all are closed. None of the heat-generating components 205A-D in processor portion 200 are cooled (all still white in color in figure) in the example.

The above-described selective cooling configurations, and shown in FIGS. 8A-8E, are examples, and other suitable configurations for the heat sink are also contemplated by the disclosure.

Figure 9:
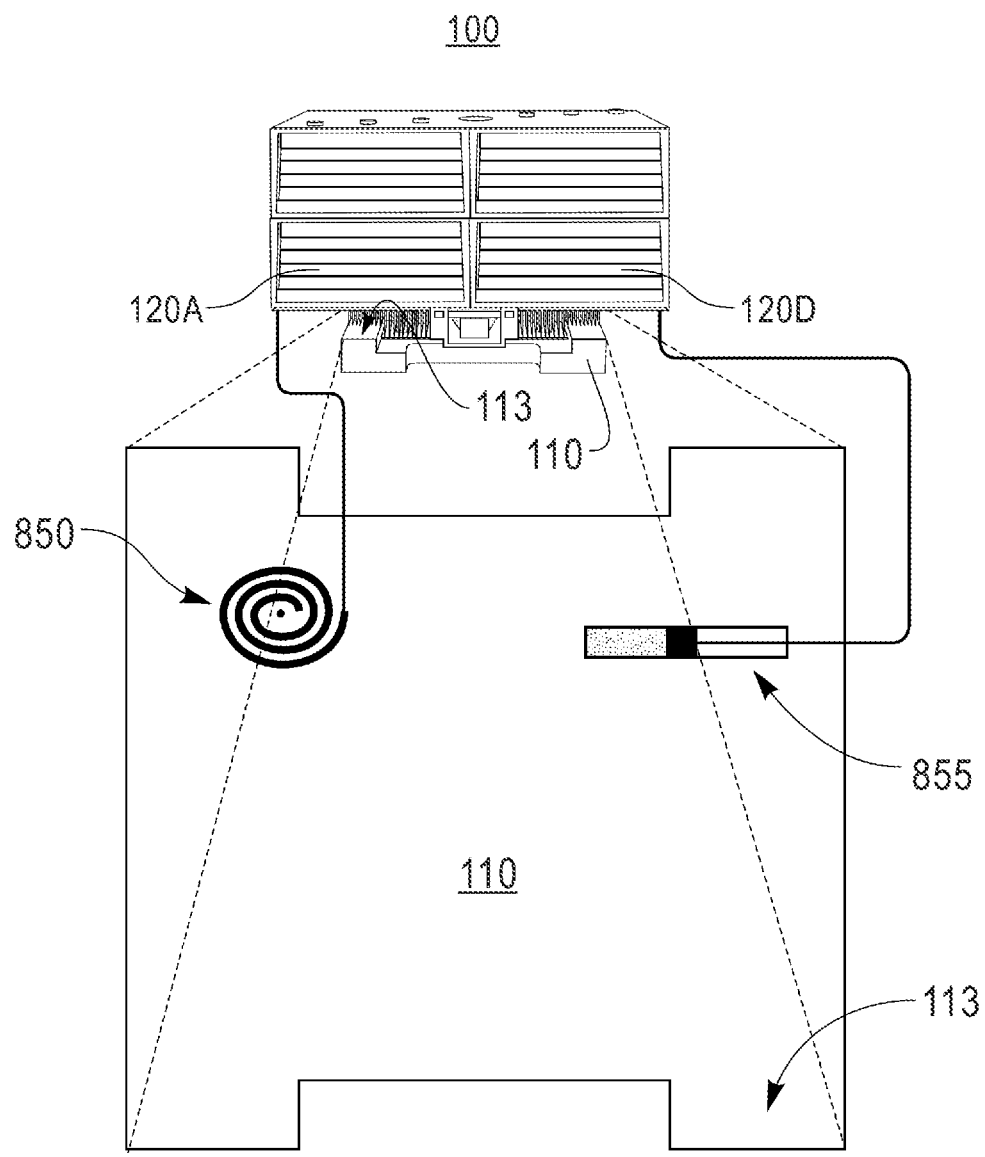
FIG. 9 illustrates examples of automated airflow balance embodiments, in accordance with embodiments of the disclosure.

In order to activate (or actuate) a certain set or sets of fins in the fin stack 124 and/or a set or sets of louvers in the heat sink 100 to allow for selective dissipation of heat from heat-generating components, different passive and active processes are contemplated by the disclosure. For example, in FIG. 9, two examples of active processes for heat dissipation are shown. FIG. 9 illustrates the heat sink 100 and an expanded, close-up view from the top surface 113 side of the base plate 110 of the heat sink 100.

A first example embodiment of an active balancing of airflow in the heat sink 100 is a micro-thermal torsion spring 850 located in or adjacent the base plate 110 of the heat sink 100 that can also be located proximate one of a plurality of heat-generating components under the heat sink 100. The torsion spring 850 can surround, for example, an exposed heat pipe (not shown) of the plurality of heat pipes 115A-L (shown in other figures) upon exiting the base plate 110. A spring constant and thermal expansion of the torsion spring 850 can be inherent due to the geometry of the torsion spring 850. If, for example, the torsion spring 850 is exposed to a certain amount of heat from one of the heat-generating components, the torsion spring 850 can expand and, from its remote location, activate the corresponding set of louvers (such as 120A) to open to provide for cooling of the corresponding set of fins (not visible, but the set of fins is visible in FIG. 2, for example). As a result of the set of louvers 120A opening, the corresponding heat-generating component can be cooled. A plurality of torsion springs, such as torsion spring 850, can be located in base plate 110, such that one torsion spring is located around each of the included heat pipes (such as heat pipes 115A-L, shown in other figures) in the heat sink 100.

Another example of a component that can be used for active balancing of airflow balance in the heat sink 100 is also shown in FIG. 9. A micro-hydraulic thermal piston linear actuator 855 can be embedded in (or be located adjacent) the base plate 110 proximate one of the plurality of heat-generating components (not shown, but such as 205D in FIG. 3). Heat coming from one of the heat-generating components can cause a piston in the thermal piston linear actuator 855 to move and such movement, from its remote location, can cause a corresponding set of louvers to open to provide for cooling of a corresponding set of fins and the corresponding heat-generating component. As shown in FIG. 9, the set of louvers 120D are opened by the response of the thermal piston linear actuator 855 being exposed to heat, and the corresponding set of fins 125D (as visible in FIG. 2) can allow for cooling of the heat-generating component located below. A plurality of thermal piston linear actuators, such as 855, can be located in base plate 110, such that each thermal piston linear actuator can activate one set of louvers 120A-D to open and allow airflow to a corresponding set of fins 125A-D (see FIG. 2) in the heat sink 100.

Other suitable processes or devices that can be used to detect heat coming from a particular heat-generating component or components and that can activate or open one or more of the plurality of sets of louvers (such as 120A-D) for example, in the heat sink (such as 100) are also contemplated by the disclosure. These processes or devices can be used to activate all of the sets of louvers in a given heat sink. The two example processes for activation of louvers are shown in FIG. 9 with regard to only one set of louvers for simplification purposes.

Figure 10:
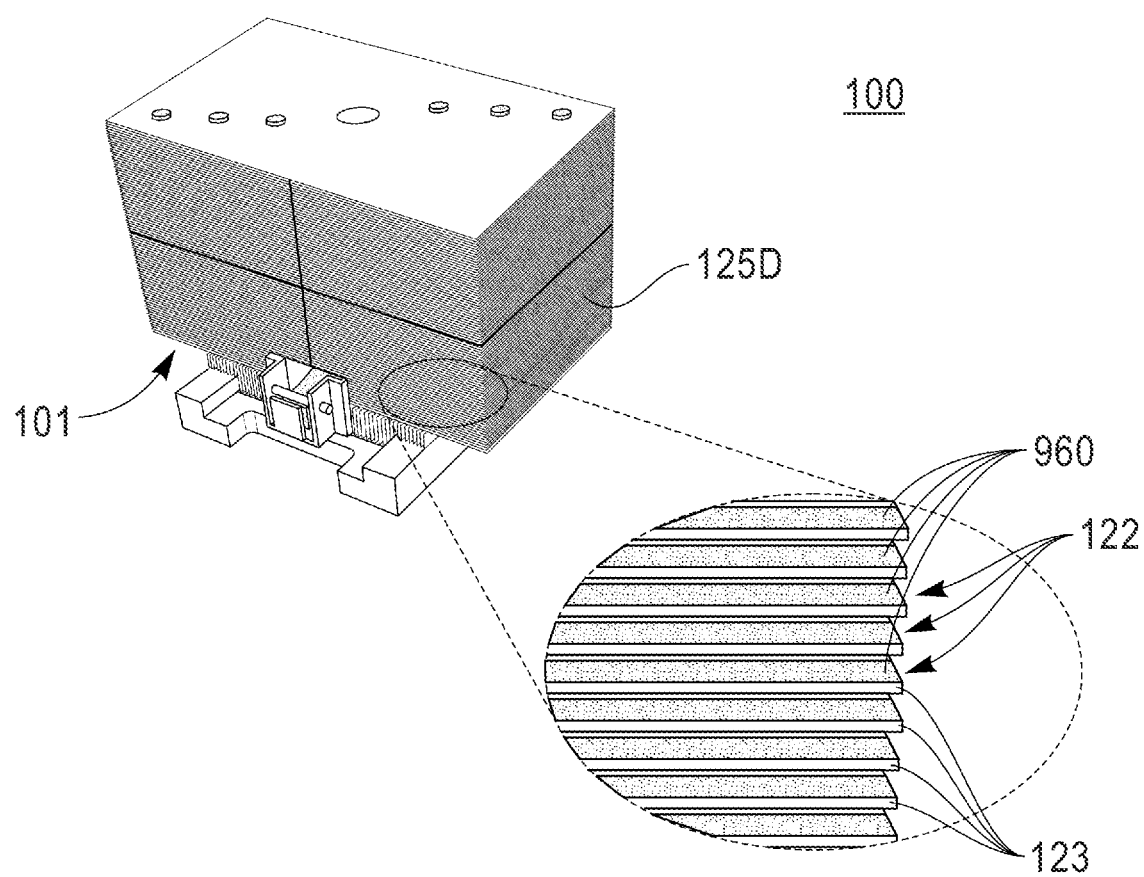
FIG. 10 illustrates a close-up view of an example of a portion of a set of fins in the heat sink shown in FIG. 1, in accordance with embodiments of the disclosure.

FIG. 10 illustrates one example of a structure that enables an example passive process for balancing automated airflow in the heat sink 100. One set of fins 125D in the heat sink 100 is shown with a portion in a close-up view. As shown, fill strips 960 can be located between the individual fins 126 in the set of fins 125D, as shown. The fill strips 960 can be located at a leading edge (figure indicates a few of the leadings edges as 122) of each fin 126, for example. The fill strips 960 can, for example, be comprised of a shape memory alloy that changes shape, such that it expands with heat and contracts with coolness, in order to fill or open, accordingly, spaces between the fins 126 to decrease or increase airflow through selected fins 126 in the heat sink 100, and thereby through the set of fins (125D shown in FIG. 2) that corresponds. In another example (not shown), the fill strips 960 can be attached to an electrical current that can control their expansion and contraction in response to heat generation by a corresponding heat-generating component, in order to automate airflow. Other suitable configurations and materials for such fill strips 960 are also contemplated by the disclosure. The fill strips 960 could be used on all sets of fins in a given heat sink. Specifically, the fill strips 960 can be included or attached at the leading portion or edge (such as 122) of the sets of fins 125A-D that is adjacent the sets of louvers 120A-D (as shown in FIG. 1). Alternatively, however, the fill strips 960 can be located at other locations within the sets of fins 125A-D in the heat sink 100.

Figure 11:
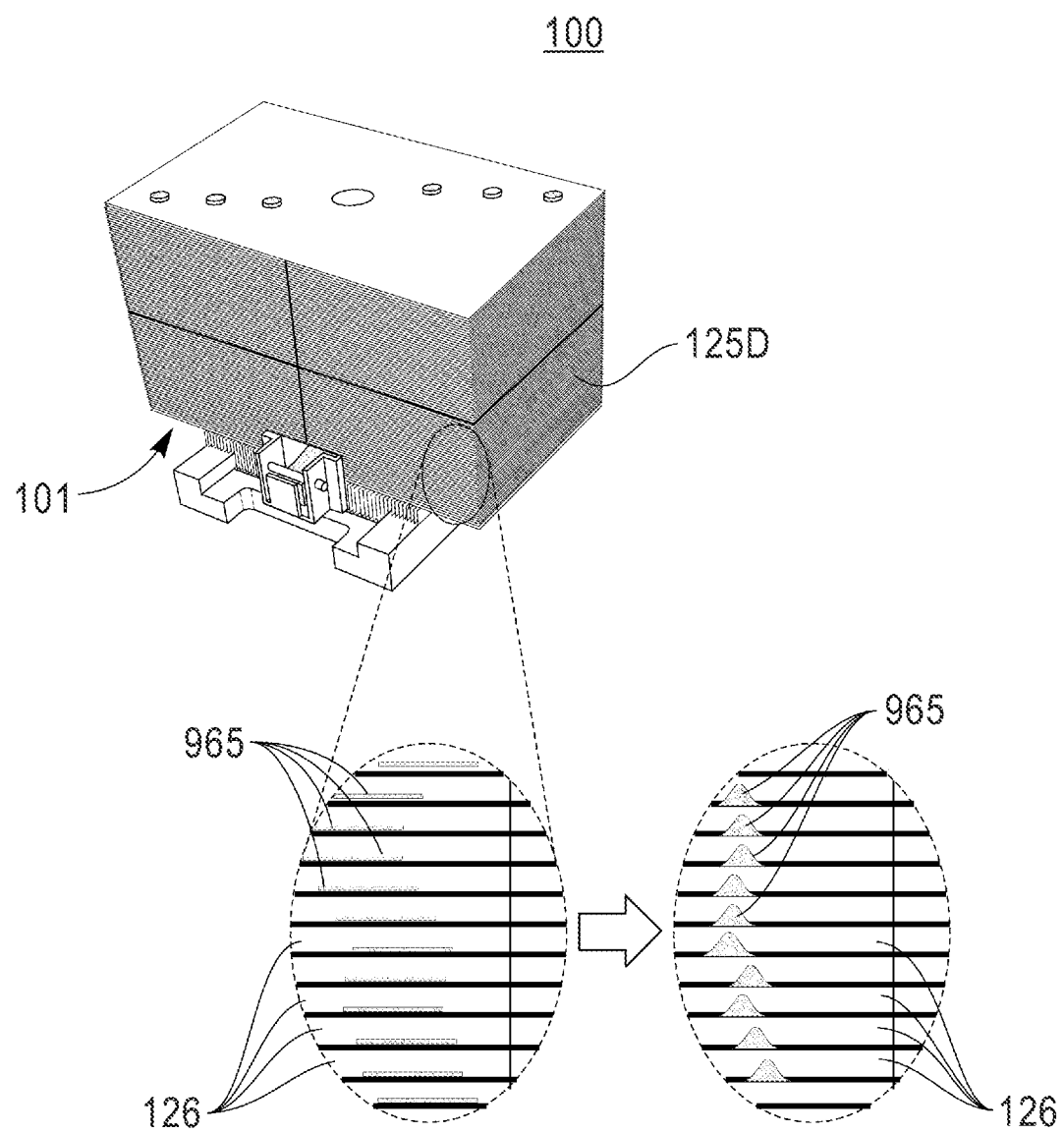
FIG. 11 illustrates a close-up view of an example of a portion of a set of fins in the heat sink shown in FIG. 1, in accordance with embodiments of the disclosure.

FIG. 11 illustrates another example of a structure that enables a passive process for balancing automated airflow in the heat sink 100. The fins 126 of one set of fins 125D in the heat sink 100 are shown with a portion in a close-up view. As shown, pieces of a heat memory alloy 965 can be attached to and located between the fins 126. The heat memory alloy pieces 965 can have a first shape (shown on left) that results from low heat that allows the fins 126 to remain open to airflow therethrough. The first shape can be relatively flat or planar, for example. The heat memory alloy pieces 965 can also have a second shape (shown on right) that results from high heat (or raised heat) that allows the fins 126 to have a at least a portion of openings between the fins 126 filled, and thereby partially or completely closing fins 126 to airflow therethrough. The second shape can results from heat exposure, and can be a raised-shape as shown. Other suitable shapes and structures that can be used to passively fill and open up the openings between the fins 126 in the sets of fins 125D are also contemplated. This process could be used on a portion of, or on all, sets of fins in a given heat sink. Specifically, the heat memory alloy pieces 965 can be included or attached to a leading portion or edge of the sets of fins 125A-D that is adjacent the sets of louvers 120A-D (as shown in FIG. 1) in order to selectively limit airflow through one or more of the sets of fins 125A-D. Alternatively, however, the heat memory alloy pieces 965 can be located at other positions within the set of fins 125A-D in the heat sink 100.

In other embodiments, fans can also be used to assist in cooling of heat-generating components. One or more fans are not shown but can be located proximate the heat sink 100 of FIG. 1 to assist in cooling.

Figure 12:
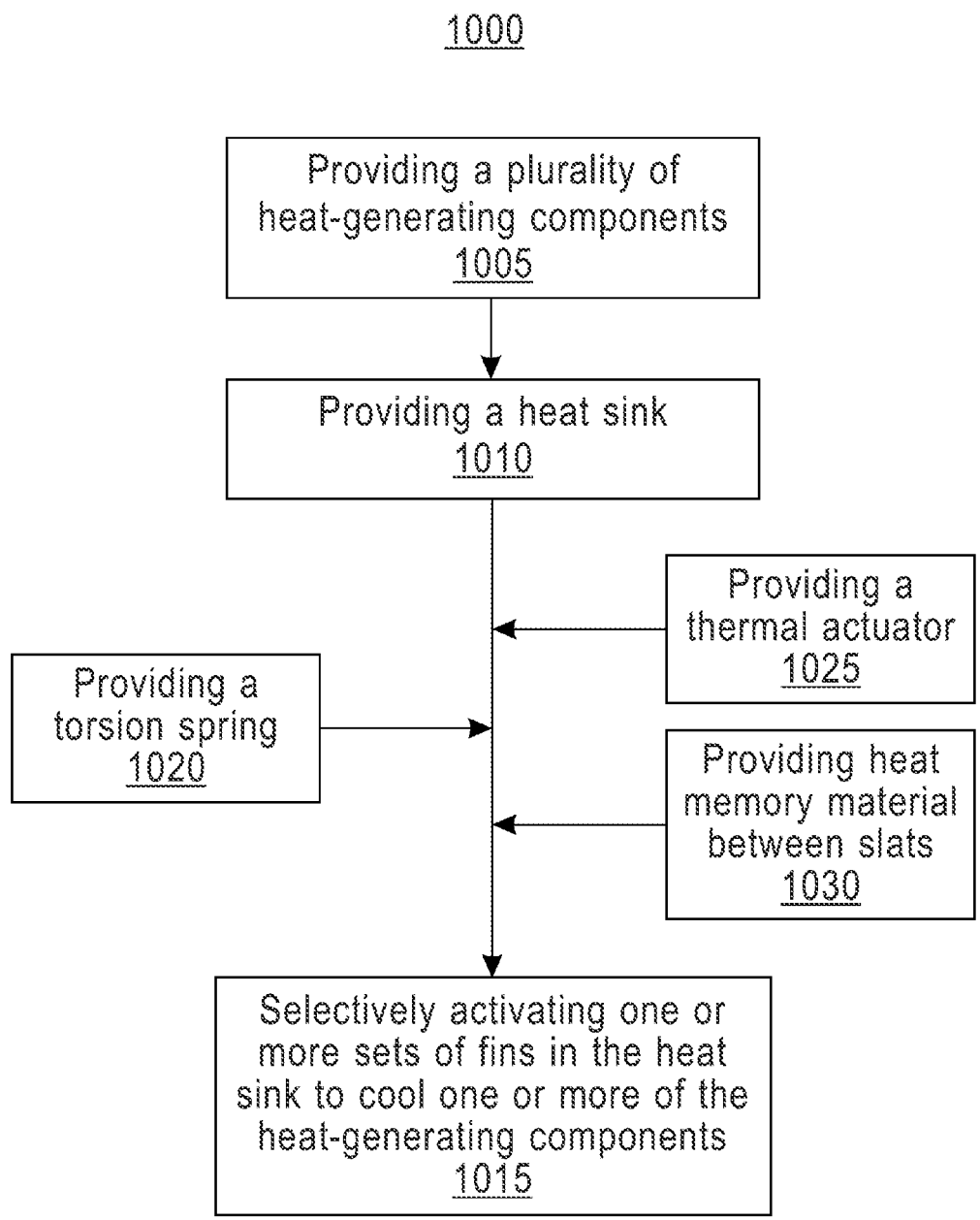
FIG. 12 is a flow diagram illustrating a process for selectively dissipating heat from at least one of a plurality of heat-generating components of a multi-chip module, in accordance with embodiments of the disclosure.

FIG. 12 is a flow diagram illustrating an example process 1000 for selectively dissipating heat from at least one of a plurality of heat-generating components of a multi-chip module. A first operation in the process is shown at 1005, and is providing a plurality of heat-generating components. A next operation is shown at 1010, and is providing a heat sink comprising, for example: a plurality of heat pipes; a base plate having a top surface and having a bottom surface for attaching to the plurality of heat-generating components, wherein the base plate is configured to locate at least one of the plurality of heat pipes proximate each of the plurality of heat-generating components; a plurality of sets of fins operable to dissipate heat generated by the heat-generating components, wherein each of the plurality of sets of fins is configured to dissipate heat from one of the plurality of heat-generating components; and a plurality of sets of louvers, wherein each of the plurality of sets of louvers is associated with one of the plurality of sets of fins and is operable to open to selectively allow airflow from outside the heat sink to dissipate heat from one of the plurality of sets of fins. A further operation is shown at 1015, and is selectively activating at least one of a plurality of sets of fins in the heat sink to cool one or more of the plurality of heat-generating components.

Additionally, the process 1000 can include specific examples of operations to selectively activate one or more sets of fins in the heat sink. As shown at 1020, an operation is included of providing at least one torsion spring. As described above with regard to FIG. 9, at least one torsion spring can be located in the base plate, and can be surrounding at least one of the plurality of heat pipes, connected to at least one of the plurality of sets of louvers, and configured to expand with heat and activate (or actuate) the at least one set of louvers to open and allow heat to be dissipated from at least one of the plurality of heat-generating components. Alternatively, the process 1000 can include an operation as shown at 1025, which is providing at least one thermal actuator (as described above with regarding to FIG. 9) located in the base plate, proximate at least one of the plurality of heat pipes, connected to at least one of the plurality of sets of louvers, and configured to be actuated with heat and activate (or actuate) at least one of the plurality of sets of louvers to open and allow heat to be dissipated from at least one set of fins and at least one corresponding heat-generating component.

As a further alternative, the process 1000 can include an operation as shown at 1030, which is providing a plurality of portions of a heat memory material (as described above with regard to FIG. 10) located between slats in the plurality of sets of louvers configured to expand with heat or contract with lowered heat and cause at least one of the plurality of sets of fins to be open or closed and allow heat to be selectively dissipated from at least one set of fins and at least one corresponding heat-generating component.

For purposes of this description, certain aspects, advantages, and novel features of the embodiments of this disclosure are described herein. The disclosed processes, and systems should not be construed as being limiting in any way. Instead, the present disclosure is directed toward all novel and nonobvious features and aspects of the various disclosed embodiments, alone and in various combinations and sub-combinations with one another. The processes, and systems are not limited to any specific aspect or feature or combination thereof, nor do the disclosed embodiments require that any one or more specific advantages be present, or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially can in some cases be rearranged or performed concurrently. Moreover, for the sake of simplicity, the attached figures may not show the various ways in which the disclosed processes can be used in conjunction with other processes. Additionally, the description sometimes uses terms like "provide" or "achieve" to describe the disclosed processes. These terms are high-level abstractions of the actual operations that are performed. The actual operations that correspond to these terms can vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises."

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A heat sink configured to be attached to and selectively dissipate heat from a plurality of heat-generating components, the heat sink comprising:
   a plurality of heat pipes;
   a base plate having a top surface and having a bottom surface for attaching to the plurality of heat-generating components, wherein the base plate is configured to locate at least one of the plurality of heat pipes proximate to the plurality of heat-generating components;
   a plurality of sets of fins operable to dissipate heat generated by the heat-generating components, wherein the plurality of sets of fins are configured to dissipate heat from one of the plurality of heat-generating components;
   a plurality of sets of louvers; and
   at least one torsion spring surrounding at least one of the plurality of heat pipes, wherein the at least one torsion spring is configured to expand with heat and activate at least one of the plurality of sets of louvers to open and allow heat to be dissipated from at least one of the plurality of heat-generating components through at least one of the plurality of sets of fins.

2. The heat sink of claim 1, wherein the plurality of sets of fins includes at least one lower set of fins attached to the top surface of the base plate and at least one upper set of fins located above the lower set of fins, and wherein at least one of the plurality of heat pipes is attached to the at least one lower set of fins, and at least one of the plurality of heat pipes is attached to the at least one upper set of fins and extends through one of the at least one lower set of fins.

3. The heat sink of claim 2, wherein the at least one heat pipe that is attached to the at least one upper set of fins extends through a fin clearance opening in the at least one lower set of fins, the fin clearance opening being configured to prevent the at least one heat pipe that is attached to the at least one upper set of fins from contacting the at least one lower set of fins.

4. The heat sink of claim 1, wherein at least one of the plurality of heat pipes is associated with one heat-generating component, one set of fins and one set of louvers in order to selectively dissipate heat from the one heat-generating component.

5. The heat sink of claim 1, further comprising:
   at least one thermal actuator proximate at least one of the plurality of heat pipes, and configured to move with heat and activate at least one of the plurality of sets of louvers to open and allow heat to be dissipated from at least one of the plurality of heat-generating components through at least one of the plurality of sets of fins.

6. The heat sink of claim 1, further comprising:
   a plurality of portions of a heat memory material located in between fins in the plurality of sets of fins, wherein the heat memory material is configured to expand with heat between the fins and block airflow between the fins.

7. The heat sink of claim 1, further comprising:
   at least one vapor chamber attached to at least one of the plurality of heat pipes proximate the base plate.

8. A heat sink configured to be attached to and selectively dissipate heat from a plurality of heat-generating components, the heat sink comprising:
   a plurality of heat pipes;
   a base plate having a top surface and having a bottom surface for attaching to the plurality of heat-generating components, wherein the base plate is configured to locate at least one of the plurality of heat pipes proximate the plurality of heat-generating components;
a plurality of sets of fins operable to dissipate heat generated by the heat- generating components, wherein the plurality of sets of fins are configured to dissipate heat from one of the plurality of heat-generating components;
a plurality of sets of louvers; and
at least one thermal actuator proximate at least one of the plurality of heat pipes, wherein the at least one thermal actuator is configured to move with heat and activate at least one of the plurality of sets of louvers to open and allow heat to be dissipated from at least one of the plurality of heat- generating components through at least one of the plurality of sets of fins.

9. The heat sink of claim 8, wherein the plurality of sets of fins includes at least one lower set of fins attached to the top surface of the base plate and at least one upper set of fins located above the lower set of fins, and wherein at least one of the plurality of heat pipes is attached to the at least one lower set of fins, and at least one of the plurality of heat pipes is attached to the at least one upper set of fins and extends through one of the at least one lower set of fins.

10. The heat sink of claim 9, wherein the at least one heat pipe that is attached to the at least one upper set of fins extends through a fin clearance opening in the at least one lower set of fins, the fin clearance opening being configured to prevent the at least one heat pipe that is attached to the at least one upper set of fins from contacting the at least one lower set of fins.

11. The heat sink of claim 8, further comprising:
at least one torsion spring surrounding at least one of the plurality of heat pipes and configured to expand with heat and activate at least one of the plurality of sets of louvers to open and allow heat to be dissipated from at least one of the plurality of heat-generating components through at least one of the plurality of sets of fins.

12. The heat sink of claim 8, further comprising:
a plurality of portions of a heat memory material located in between fins in the plurality of sets of fins, wherein the heat memory material is configured to expand with heat between the fins and block airflow between the fins.

13. A heat sink configured to be attached to and selectively dissipate heat from a plurality of heat-generating components, the heat sink comprising:
a plurality of heat pipes;
a base plate having a top surface and having a bottom surface for attaching to the plurality of heat-generating components, wherein the base plate is configured to locate at least one of the plurality of heat pipes proximate the plurality of heat-generating components;
a plurality of sets of fins operable to dissipate heat generated by the heat-generating components, wherein the plurality of sets of fins are configured to dissipate heat from one of the plurality of heat-generating components;
a plurality of sets of louvers, wherein the plurality of sets of louvers is associated with one of the plurality of sets of fins and is operable to open to selectively allow airflow from outside the heat sink to dissipate heat from one of the plurality of sets of fins; and
a plurality of portions of a heat memory material located in between fins in the plurality of sets of fins, wherein the heat memory material is configured to expand with heat between the fins and block airflow between the fins.

14. The heat sink of claim 13, wherein the plurality of sets of fins includes at least one lower set of fins attached to the top surface of the base plate and at least one upper set of fins located above the lower set of fins, and wherein at least one of the plurality of heat pipes is attached to the at least one lower set of fins, and at least one of the plurality of heat pipes is attached to the at least one upper set of fins and extends through one of the at least one lower set of fins.

15. The heat sink of claim 14, wherein the at least one heat pipe that is attached to the at least one upper set of fins extends through a fin clearance opening in the at least one lower set of fins, the fin clearance opening being configured to prevent the at least one heat pipe that is attached to the at least one upper set of fins from contacting the at least one lower set of fins.

16. The heat sink of claim 13, wherein at least one of the plurality of heat pipes is associated with one heat-generating component, one set of fins and one set of louvers in order to selectively dissipate heat from the one heat-generating component.

17. The heat sink of claim 13, further comprising:
providing at least one thermal actuator proximate at least one of the plurality of heat pipes, and configured to move with heat and activate at least one of the plurality of sets of louvers to open and allow heat to be dissipated from at least one of the plurality of heat-generating components through at least one of the plurality of sets of fins.

18. The heat sink of claim 13, further comprising:
at least one vapor chamber attached to at least one of the plurality of heat pipes proximate the base plate.

* * * * *